(12) United States Patent
Lee et al.

(10) Patent No.: US 10,276,228 B1
(45) Date of Patent: Apr. 30, 2019

(54) DRAM AND METHOD OF OPERATING THE SAME

(71) Applicant: NANYA TECHNOLOGY CORPORATION, New Taipei (TW)

(72) Inventors: Chung-Hsun Lee, New Taipei (TW); Hsien-Wen Liu, Taoyuan County (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 2 days.

(21) Appl. No.: 15/900,298

(22) Filed: Feb. 20, 2018

Related U.S. Application Data

(60) Provisional application No. 62/609,618, filed on Dec. 22, 2017.

(51) Int. Cl.
| G11C 7/00 | (2006.01) |
| G11C 11/406 | (2006.01) |
| G11C 11/4076 | (2006.01) |
| G11C 7/10 | (2006.01) |
| G11C 29/02 | (2006.01) |

(52) U.S. Cl.
CPC ...... *G11C 11/40626* (2013.01); *G11C 7/1051* (2013.01); *G11C 7/1075* (2013.01); *G11C 11/406* (2013.01); *G11C 11/4076* (2013.01); *G11C 29/02* (2013.01)

(58) Field of Classification Search
CPC ............ G11C 11/40626; G11C 11/406; G11C 11/4076; G11C 29/02; G11C 11/4074; G11C 8/18

See application file for complete search history.

(56) References Cited

U.S. PATENT DOCUMENTS

| 6,452,852 B2* | 9/2002 | Bohm | G11C 11/22 365/145 |
| 7,027,343 B2* | 4/2006 | Sinha | G11C 11/406 365/189.07 |
| 9,679,490 B2* | 6/2017 | Ceribelli | G05D 1/0005 |
| 9,905,285 B2* | 2/2018 | Cho | G11C 11/4074 |

* cited by examiner

*Primary Examiner* — Pho M Luu
(74) *Attorney, Agent, or Firm* — Muncy, Geissler. Olds & Lowe, P.C.

(57) ABSTRACT

A dynamic random access memory (DRAM) DRAM includes a memory array, a temperature sensor and a control device. The temperature sensor is configured to sense a temperature of the DRAM. The control device is configured to adjust a sense frequency based on a retention ability of the memory array, and to activate the temperature sensor according to the adjusted sense frequency.

20 Claims, 15 Drawing Sheets

DRAM AND METHOD OF OPERATING THE SAME

PRIORITY CLAIM AND CROSS-REFERENCE

This application claims the benefit of provisional application Ser. 62/609,618 filed on Dec. 22, 2017 and entitled "DRAM," the disclosure of which is hereby incorporated by reference in its entirety.

TECHNICAL FIELD

The present disclosure relates to a dynamic random access memory (DRAM) and a method of operating the same, and more particularly, to management of a temperature-sensing operation of a DRAM.

DISCUSSION OF THE BACKGROUND

Dynamic random access memory (DRAM) is a type of random access memory that stores each bit of data in a separate capacitor. A simplest DRAM cell comprises a single N-type metal-oxide-semiconductor (NMOS) transistor and a single capacitor. If charge is stored in the capacitor, the cell is said to store a logic HIGH, depending on the convention used. If no charge is present, the cell is said to store a logic LOW. Because the charge in the capacitor dissipates over time, DRAM systems require additional refreshing circuitries to periodically refresh the charge stored in the capacitors. Since a capacitor can store only a very limited amount of charge, in order to quickly distinguish the difference between a logic HIGH and a logic LOW, two bit lines (BLs) are typically used for each bit, wherein the first bit line in the bit line pair is known as a bit line true (BLT) and the other bit line in the bit line pair is the bit line complement (BLC). The single NMOS transistor's gate is controlled by a word line (WL). The DRAM functions to adjust a refresh rate based on a temperature sensed by a temperature sensor.

This Discussion of the Background section is for background information only. The statements in this Discussion of the Background are not an admission that the subject matter disclosed in this section constitutes a prior art to the present disclosure, and no part of this section may be used as an admission that any part of this application, including this Discussion of the Background section, constitutes prior art to the present disclosure.

SUMMARY

One aspect of the present disclosure provides a dynamic random access memory (DRAM). The DRAM includes a memory array, a temperature sensor and a control device. The temperature sensor is configured to sense a temperature of the DRAM. The control device is configured to adjust a sense frequency based on a retention ability of the memory array, and to activate the temperature sensor according to the adjusted sense frequency.

In some embodiments, the control device is further configured to adjust the sense frequency based on the temperature.

In some embodiments, the control device is further configured to adjust the sense frequency to a first sense frequency in response to an event in which the temperature satisfies a threshold temperature.

In some embodiments, the control device is further configured to adjust the sense frequency to a second sense frequency greater than the first sense frequency in response to an event in which the temperature does not satisfy the threshold temperature.

In some embodiments, the control device is further configured to adjust the sense frequency based on a refresh rate of the memory array for a self-refresh operation.

In some embodiments, the control device is further configured to adjust the sense frequency to a first sense frequency in response to an event in which the refresh rate satisfies a threshold refresh rate.

In some embodiments, the control device is further configured to adjust the sense frequency to a second sense frequency greater than the first sense frequency in response to an event in which the refresh rate does not satisfy the threshold refresh rate.

In some embodiments, the control device is further configured to adjust the sense frequency based on both the temperature and a refresh rate of the memory array for a self-refresh operation.

In some embodiments, the control device is further configured to adjust the sense frequency based on the temperature in a coarse-tune manner, and to adjust the sense frequency based on the refresh rate in a fine-tune manner.

In some embodiments, the DRAM further includes a switch controllable by the control device. The control device is configured to activate the temperature sensor by changing a conducted state of the switch according to the adjusted sense frequency.

Another aspect of the present disclosure provides a dynamic random access memory (DRAM). The DRAM includes a memory array, a temperature sensor and a control device. The temperature sensor is configured to sense a temperature of the DRAM. The control device is configured to adjust a sense frequency based on both the temperature and a refresh rate of the memory array for a self-refresh operation, and to activate the temperature sensor according to the adjusted sense frequency. The adjusted sense frequency includes a first sense frequency in response to an event in which the temperature satisfies a threshold temperature and the refresh rate satisfies a first threshold refresh rate.

In some embodiments, the adjusted sense frequency includes a second sense frequency, greater than the first sense frequency, in response to an event in which the temperature satisfies the threshold temperature and the refresh rate does not satisfy the first threshold refresh rate.

In some embodiments, the adjusted sense frequency includes a third sense frequency, greater than the second sense frequency, in response to an event in which the temperature does not satisfy the threshold temperature and the refresh rate satisfies a second threshold refresh rate lesser than the first threshold refresh rate.

In some embodiments, the adjusted sense frequency includes a fourth sense frequency, greater than the third sense frequency, in response to an event in which the temperature does not satisfy the threshold temperature and the refresh rate does not satisfy the second threshold refresh rate.

Another aspect of the present disclosure provides a method of operating a dynamic random access memory (DRAM). The method comprises: sensing a temperature of the DRAM by a temperature sensor; adjusting a sense frequency based on a retention ability of the memory array; and activating the temperature sensor according to the adjusted sense frequency.

In some embodiments, the method further comprises: adjusting the sense frequency based on the temperature.

In some embodiments, the method further comprises: adjusting the sense frequency based on a refresh rate of the memory array for a self-refresh operation.

In some embodiments, the method further comprises: adjusting the sense frequency based on both the temperature and a refresh rate of the memory array for a self-refresh operation.

In some embodiments, the method further comprises: adjusting the sense frequency based on the temperature in a coarse-tune manner; and adjusting the sense frequency based on the refresh rate in a fine-tune manner.

In some embodiments, the method further comprises: adjusting the sense frequency based on the refresh rate in a coarse-tune manner; and adjusting the sense frequency based on the temperature in a fine-tune manner.

In the present disclosure, in a circumstance in which a temperature of the DRAM is relatively low, for example 30° C., retention ability of the memory array 12 is relatively good. In response to the good retention ability, the refresh device refreshes the memory array according to a relatively low refresh rate and the control device activates the temperature sensor according to the greater sense frequency. As a result, the temperature sensor functions with greater frequency in a given period. For example, the temperature sensor senses the temperature a relatively large number of times in a given period. If the temperature increases suddenly, the refresh device is able to increase the refresh rate for a self-refresh operation promptly. As a result, a data stored by the memory array is relatively less likely to be lost.

Moreover, in the present disclosure, in a circumstance in which a temperature of the DRAM is relatively high, for example 60° C., retention ability of the memory array is relatively poor. In response to the poor retention ability, the refresh device refreshes the memory array according to a relatively high refresh rate and the control device activates the temperature sensor according to the lesser sense frequency. As a result, the temperature sensor functions with lesser frequency in a given period. For example, the temperature sensor senses the temperature a relatively smaller number of times in a given period. As a result, the DRAM is more power efficient.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be connected to the figures' reference numbers, which refer to similar elements throughout the description.

DETAILED DESCRIPTION

Figure 1:
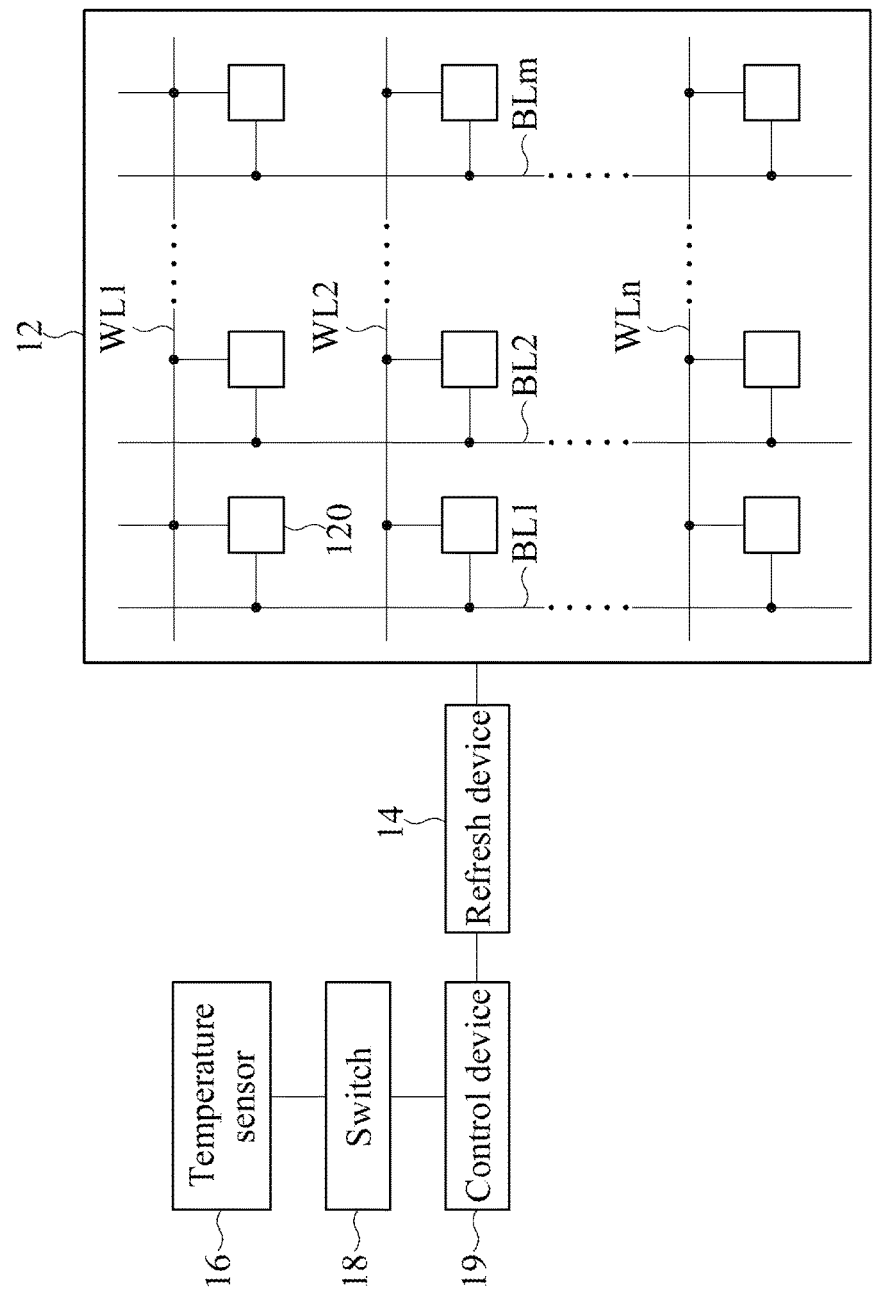
FIG. 1 is a schematic diagram of a dynamic random access memory (DRAM), in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a schematic diagram of a dynamic random access memory (DRAM) 10, in accordance with some embodiments of the present disclosure. Referring to FIG. 1, the DRAM 10 includes a memory array 12, a refresh device 14, a temperature sensor 16, a switch 18 and a control device 19.

The memory array 12 functions to store data. The memory array 12 includes a plurality of memory cells 120. The memory cell 120 functions to store data. In addition to the memory cells 120, the memory array 12 further includes a plurality of word lines WL1 to WLn and a plurality of bit lines BL1 to BLm, wherein n and m are positive integers. The word lines WL1 to WLn and the bit lines BL1 to BLm are used to control operation of the associated memory cells 120. The memory cells 120 in a single row and a word line for accessing those memory cells 120 can together be deemed as a memory row.

The refresh device 14 functions to perform a self-refresh operation on the memory array 12. The self-refresh operation refers to the procedure in which the refresh device 14 automatically executes a refresh operation by, for example, using an internal refresh counter. There is no need for the refresh device 14 to obtain any information from, for example, a processor external to the DRAM 10 to perform the self-refresh operation. The refresh device 14 and/or other devices in the DRAM 10 can generate, on their own, any information required to perform the self-refresh operation. Additionally, the refresh device 14 refreshes the memory array 12 in a fashion in which, for example, a charge is read from the memory cell 120, and the charge is immediately written back to the memory cell 120. However, the present disclosure is not limited thereto. The refresh operation may further include other detailed operations.

A temperature sensor 16 functions to sense a temperature of the DRAM 10, in particular the memory array 12. As the temperature increases, retention ability for retaining data stored by the memory array 12 decreases, resulting in a greater likelihood of the data being lost. To avoid such adverse effect, when the temperature is relatively high, the refresh device 14 refreshes the memory array 12 according to a relatively high refresh rate. A temperature positively correlates to a refresh rate.

The switch 18 is controllable by the control device 19. When the switch 18 is conducting, the temperature sensor 16 is activated. Conversely, when the switch 18 is not conducting, the temperature sensor 16 is deactivated. For example, the switch 18 is coupled between the temperature sensor 16 and a power supply. When the switch is not conducting, the temperature sensor 16 is unable to receive the power supply. Accordingly, the temperature sensor 16 is deactivated.

The control device 19 functions to control the refresh device 14, the temperature sensor 16 and the switch 18. In further detail, the control device 19 functions to adjust a sense frequency based on a retention ability of the memory array 12. Moreover, the control device 19 functions to activate the temperature sensor 16 according to the adjusted sense frequency. In an embodiment, the control device 19 functions to activate the temperature sensor 16 by changing a conducted state of the switch 18 according to the adjusted sense frequency.

In the present disclosure, in a circumstance in which a temperature of the DRAM 10 is relatively low, for example 30° C., a retention ability of the memory array 12 is relatively good. In response to the good retention ability, the refresh device 14 refreshes the memory array 12 according to a relatively low refresh rate and the control device 19 activates the temperature sensor 16 according to a greater sense frequency. As a result, the temperature sensor 16 functions with greater frequency in a given period. For example, the temperature sensor 16 senses the temperature a relatively large number of times in a given period. If the temperature increases suddenly, the refresh device 16 is able to increase the refresh rate for a self-refresh operation promptly. As a result, a data stored by the memory array 12 is less likely to be lost.

In some possible existing approaches for operating a DRAM, a temperature sensor of the DRAM senses a temperature with a fixed frequency. Alternatively, the temperature sensor senses the temperature only in response to a command from a processor external to the DRAM. That is, a sense frequency of the temperature sensor cannot be changed dynamically, and in particular cannot be changed according to a retention ability of the DRAM. As such, if the temperature increases suddenly, until the next temperature sense, a refresh device of the DRAM at a relatively high temperature continues to refresh a memory array of the DRAM according to a refresh rate that is unchanged from the refresh rate according to which the refresh device refreshes the memory array at a relatively low temperature. As a result, there is a greater likelihood of a data stored by the DRAM being lost.

Moreover, in the present disclosure, in a circumstance in which a temperature of the DRAM 10 is relatively high, for example 60° C., retention ability of the memory array 12 is relatively poor. In response to the poor retention ability, the refresh device 14 refreshes the memory array 12 according to a relatively high refresh rate and the control device 19 activates the temperature sensor 16 according to a lesser sense frequency. As a result, the temperature sensor 16 functions with lesser frequency in a given period. For example, the temperature sensor 16 senses the temperature a relatively smaller number of times in a given period. As a result, the DRAM 10 is more power efficient.

In some possible existing approaches for operating a DRAM, a temperature sensor of the DRAM senses a temperature according to a fixed sense frequency regardless of retention ability of the DRAM. Since a sense frequency of the temperature sensor cannot be decreased, in particular in an event in which the refresh device 14 refreshes the memory array 12 according a relatively high refresh rate at a relatively high temperature, the DRAM is less power efficient.

Figure 2:
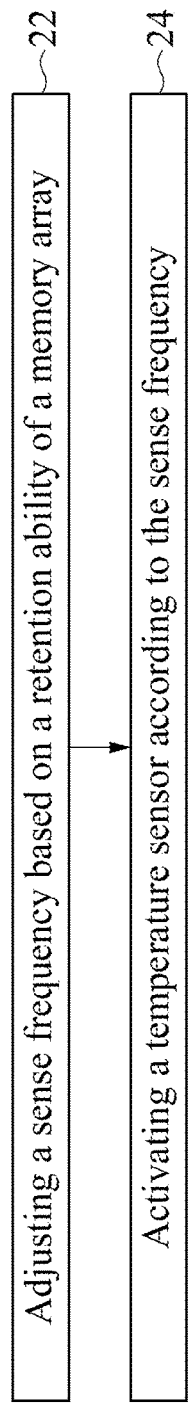
FIG. 2 is a flow chart of a method of operating a DRAM, in accordance with some embodiments of the present disclosure.

FIG. 2 is a flow chart of a method 20 of operating a DRAM, in accordance with some embodiments of the present disclosure. Referring to FIG. 2, the method 20 includes operations 22 and 24.

The method 20 begins with operation 22, in which a sense frequency is adjusted based on a retention ability of a memory array.

The method 20 proceeds to operation 24, in which a temperature sensor is activated according to the sense frequency. The temperature sensor functions to sense a temperature of the DRAM.

The method 20 is merely an example, and is not intended to limit the present disclosure beyond what is explicitly recited in the claims. Additional operations can be provided before, during, and after the method 20, and some operations described can be replaced, eliminated, or moved around for additional embodiments of the method.

Figure 3:
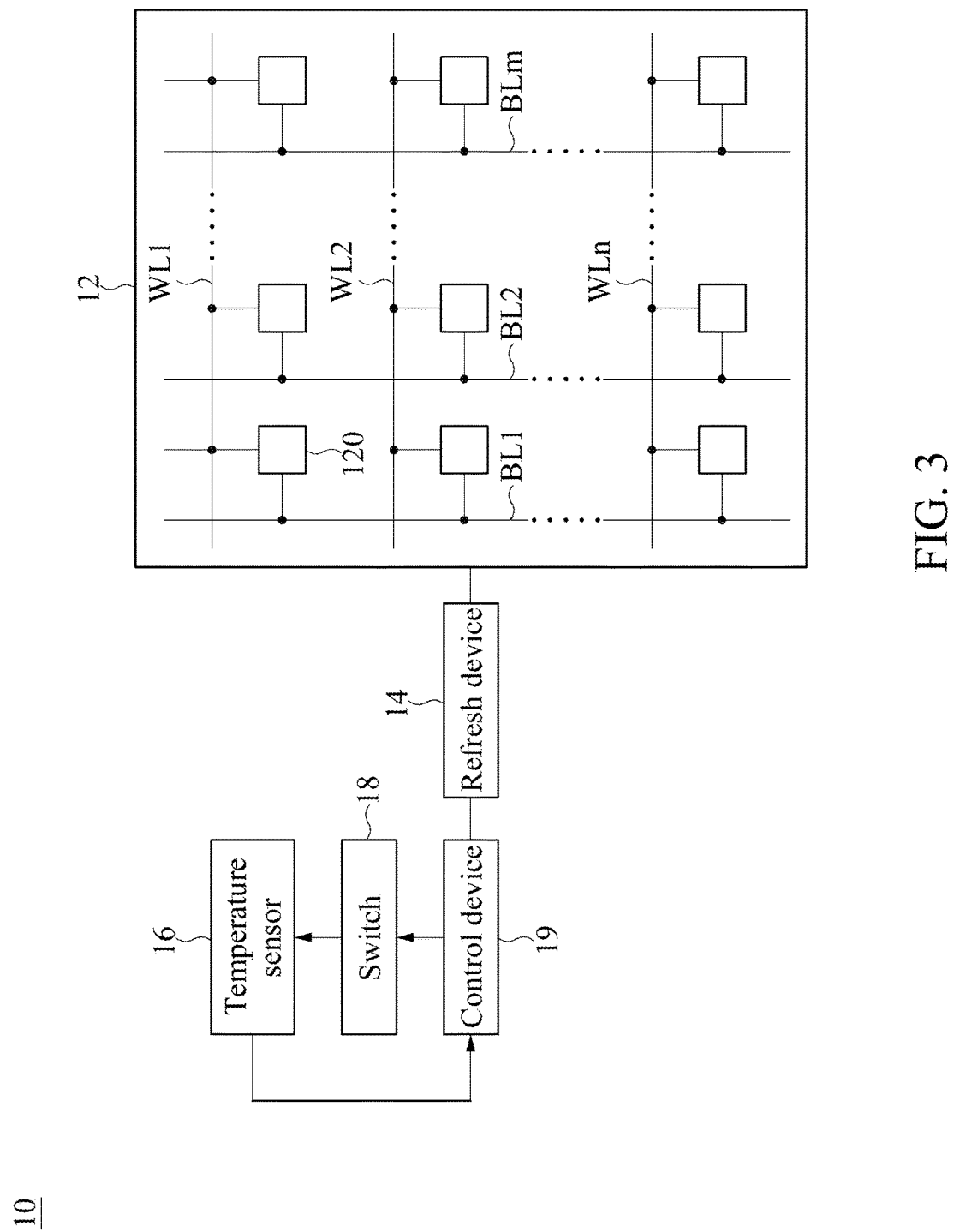
FIG. 3 is a schematic diagram illustrating an operation of the DRAM shown in FIG. 1, in accordance with some embodiments of the present disclosure.

FIG. 3 is a schematic diagram illustrating an operation of the DRAM 10 shown in FIG. 1, in accordance with some embodiments of the present disclosure. Referring to FIG. 3, the control device 19 functions to adjust a sense frequency based on a temperature sensed by the temperature sensor 16. The control device 19 functions to activate the temperature sensor 16 by changing a conducted state of the switch 18 according to the adjusted sense frequency.

Detailed operations based on the temperature of the control device 19 are illustrated and described with reference to FIGS. 4 and 5.

Figure 4:
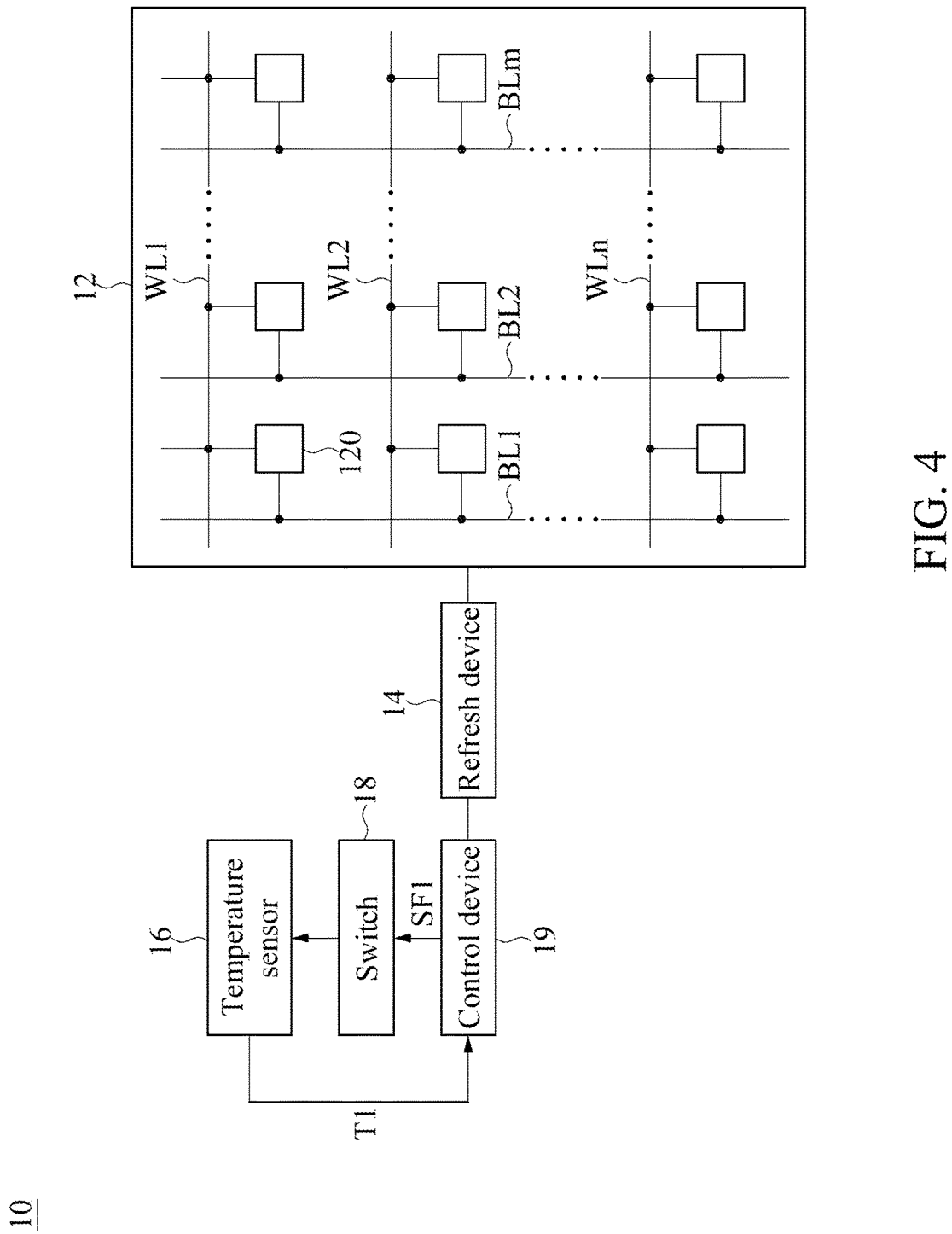
FIG. 4 is a schematic diagram illustrating a first scenario of the operation shown in FIG. 3, in accordance with some embodiments of the present disclosure.

FIG. 4 is a schematic diagram illustrating a first scenario of the operation shown in FIG. 3, in accordance with some embodiments of the present disclosure. Referring to FIG. 4, the temperature sensor 16 senses a relatively high temperature T1. The control device 19 adjusts the sense frequency to a relatively low sense frequency SF1 based on the relatively high temperature T1, and activates the temperature sensor 16 according to the relatively low sense frequency SF1.

Figure 5:
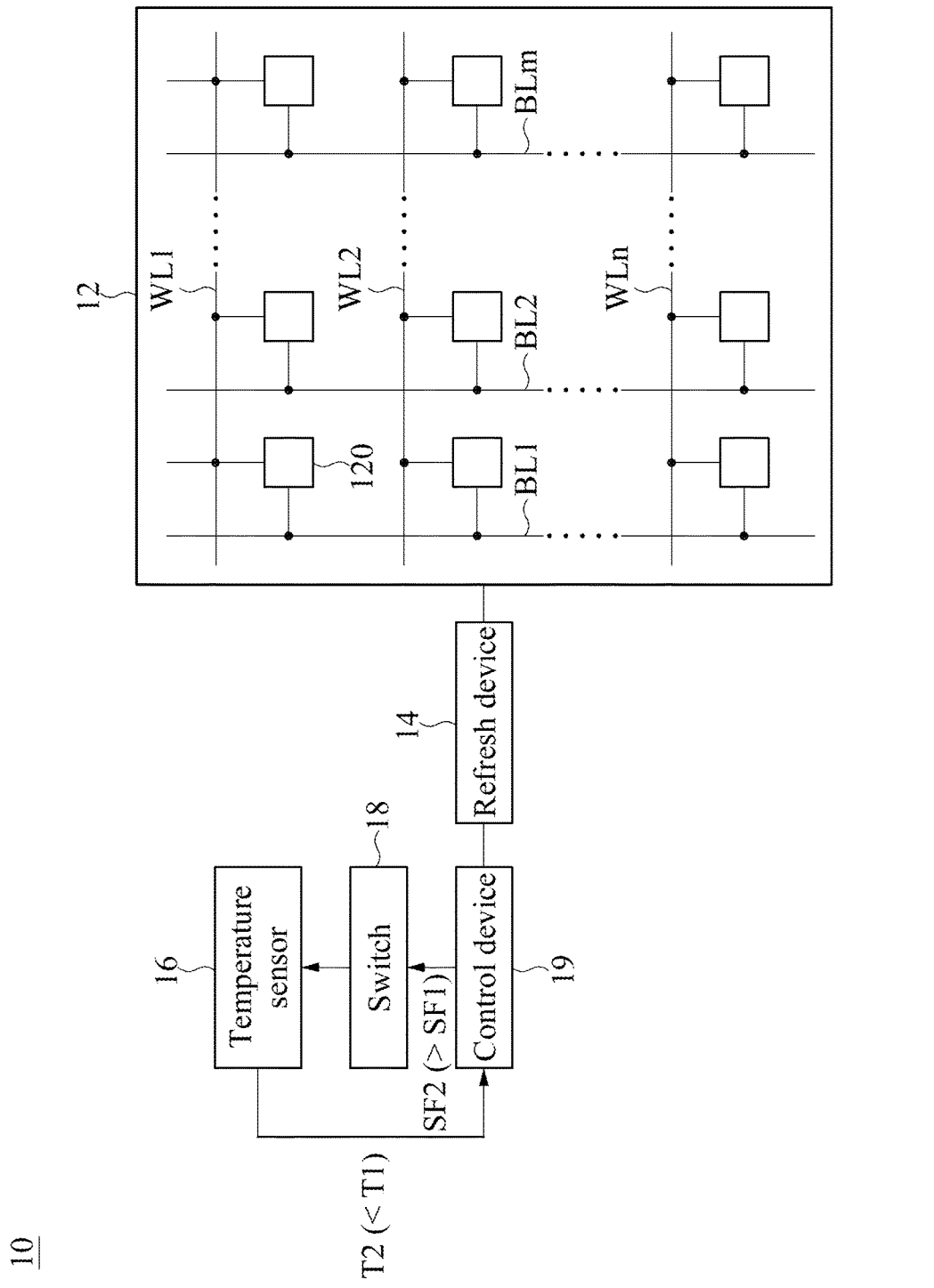
FIG. 5 is a schematic diagram illustrating a second scenario of the operation shown in FIG. 3, in accordance with some embodiments of the present disclosure.

FIG. 5 is a schematic diagram illustrating a second scenario of the operation shown in FIG. 3, in accordance with some embodiments of the present disclosure. Referring to FIG. 5, the temperature sensor 16 senses a relatively low temperature T2, lower than the temperature T1. The control device 19 adjusts the sense frequency to a relatively high sense frequency SF2, higher than the sense frequency SF1, based on the relatively low temperature T2 and activates the temperature sensor 16 according to the relatively high sense frequency SF2.

As previously mentioned, in the present disclosure, the control device 19 is able to dynamically change a sense frequency of the temperature sensor 16. Hence, if a temperature increases suddenly, the refresh device 16 is able to increase a refresh rate for a self-refresh operation promptly. As a result, a data stored by the memory array 12 is relatively less likely to be lost. Moreover, the temperature sensor 16 senses the temperature a relatively smaller number of times in a given period when the temperature is relatively high. As a result, the DRAM 10 is more power efficient.

Figure 6:
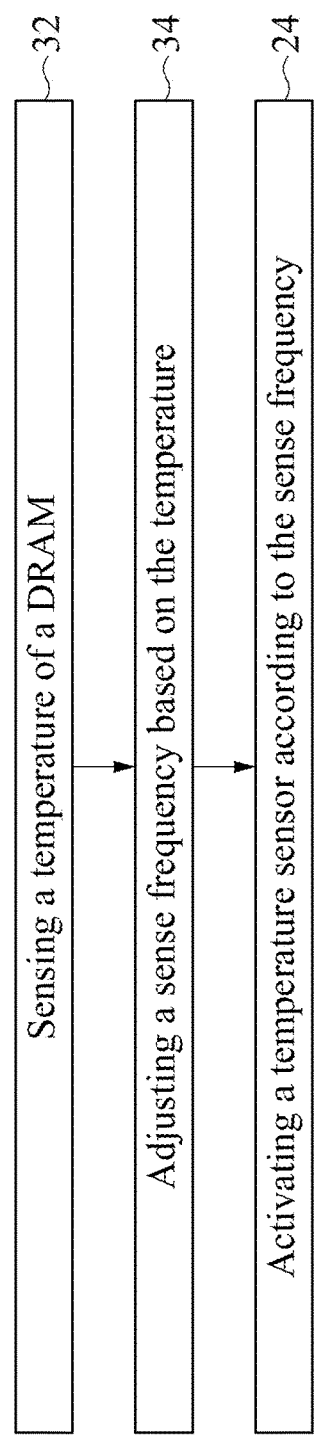
FIG. 6 is a flow chart of another method of operating a DRAM, in accordance with some embodiments of the present disclosure.

FIG. 6 is a flow chart of another method 30 of operating a DRAM, in accordance with some embodiments of the present disclosure. Referring to FIG. 6, the method 30 is similar to the method 20 described and illustrated with reference to FIG. 2 except that, for example, the method 30 includes operations 32 and 34.

The method 30 begins with operation 32, in which a temperature of a DRAM is sensed by a temperature sensor.

The method 30 proceeds to operation 34, in which a sense frequency is adjusted based on the temperature.

The method 30 is merely an example, and is not intended to limit the present disclosure beyond what is explicitly recited in the claims. Additional operations can be provided before, during, and after the method 30, and some operations described can be replaced, eliminated, or moved around for additional embodiments of the method.

Figure 7:
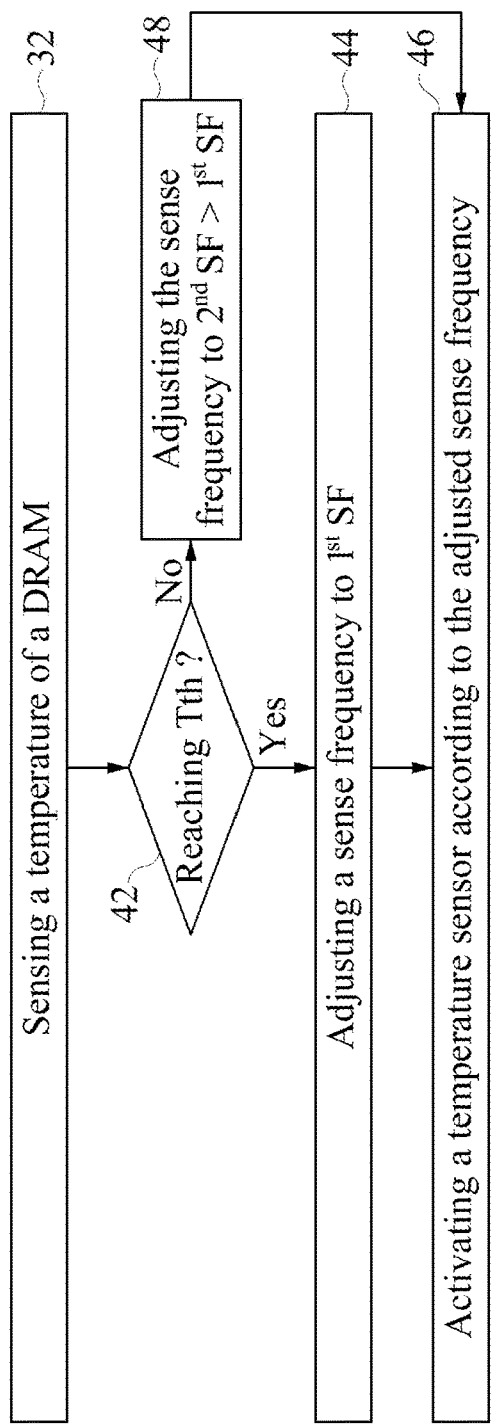
FIG. 7 is a flow chart of yet another method of operating a DRAM, in accordance with some embodiments of the present disclosure.

FIG. 7 is a flow chart of yet another method 40 of operating a DRAM, in accordance with some embodiments of the present disclosure. Referring to FIG. 7, the method 40 is similar to the method 30 described and illustrated with reference to FIG. 6 except that, for example, the method 40 further includes operations 42, 44, 46 and 48.

In operation 42, it is determined whether the temperature satisfies a threshold temperature (Tth). If affirmative, the method 40 proceeds to operation 44, in which a sense frequency is adjusted to a first sense frequency ($1^{st}$ SF). If negative, the method 40 proceeds to operation 48, in which the sense frequency is adjusted to a second sense frequency ($2^{nd}$ SF) greater than the first sense frequency.

Subsequent to operations 44 and 48, in operation 46, the temperature sensor is activated according to the adjusted sense frequency.

The method 40 is merely an example, and is not intended to limit the present disclosure beyond what is explicitly recited in the claims. Additional operations can be provided before, during, and after the method 40, and some operations described can be replaced, eliminated, or moved around for additional embodiments of the method.

Figure 8:
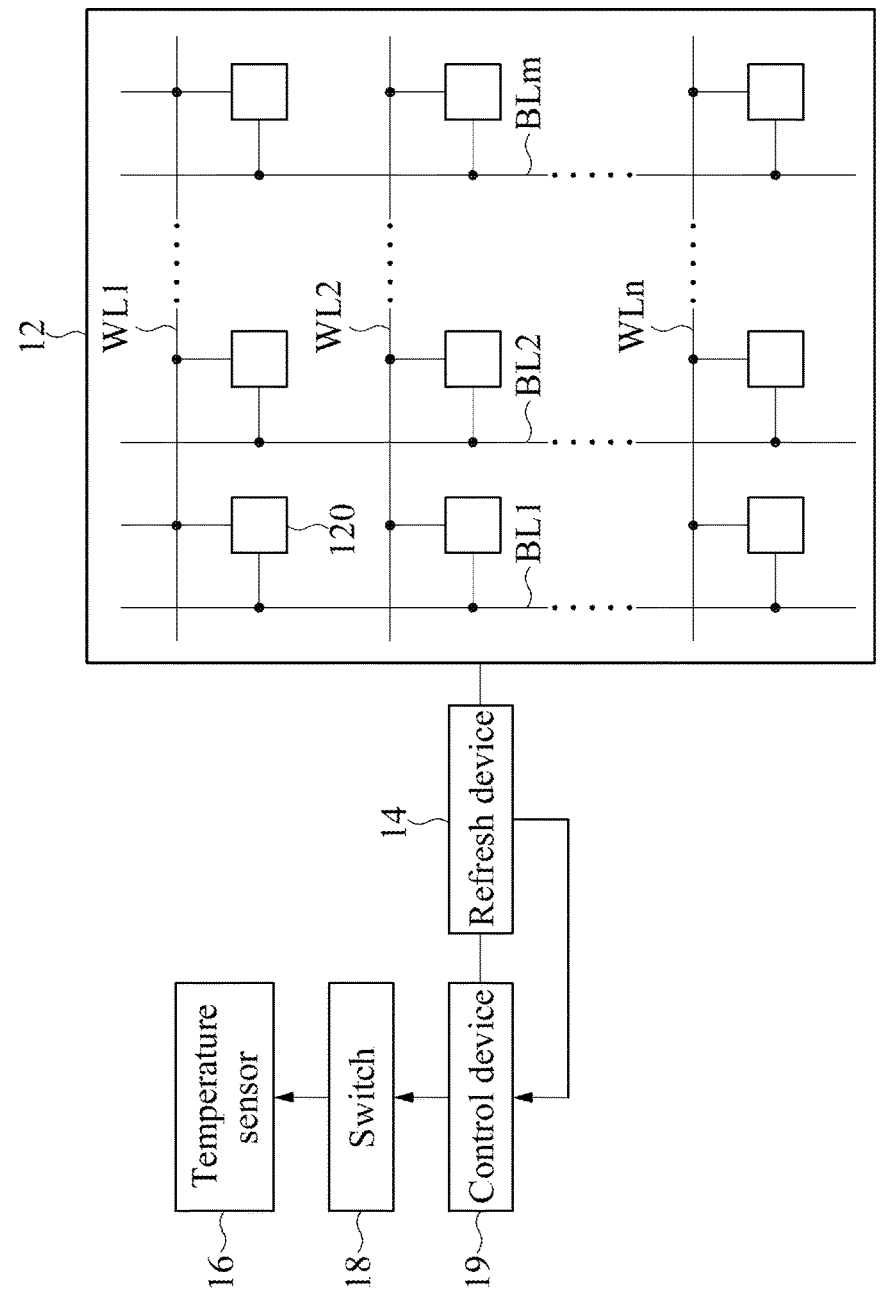
FIG. 8 is a schematic diagram illustrating another operation of the DRAM shown in FIG. 1, in accordance with some embodiments of the present disclosure.

FIG. 8 is a schematic diagram illustrating another operation of the DRAM 10 shown in FIG. 1, in accordance with some embodiments of the present disclosure. Referring to FIG. 8, the control device 19 functions to adjust the sense frequency based on a refresh rate for a self-refresh operation. The control device 19 functions to activate the temperature sensor 16 by changing a conducted state of the switch 18 according to the adjusted sense frequency.

Detailed operations based on the refresh rate of the control device 19 are illustrated and described with reference to FIGS. 9 and 10.

Figure 9:
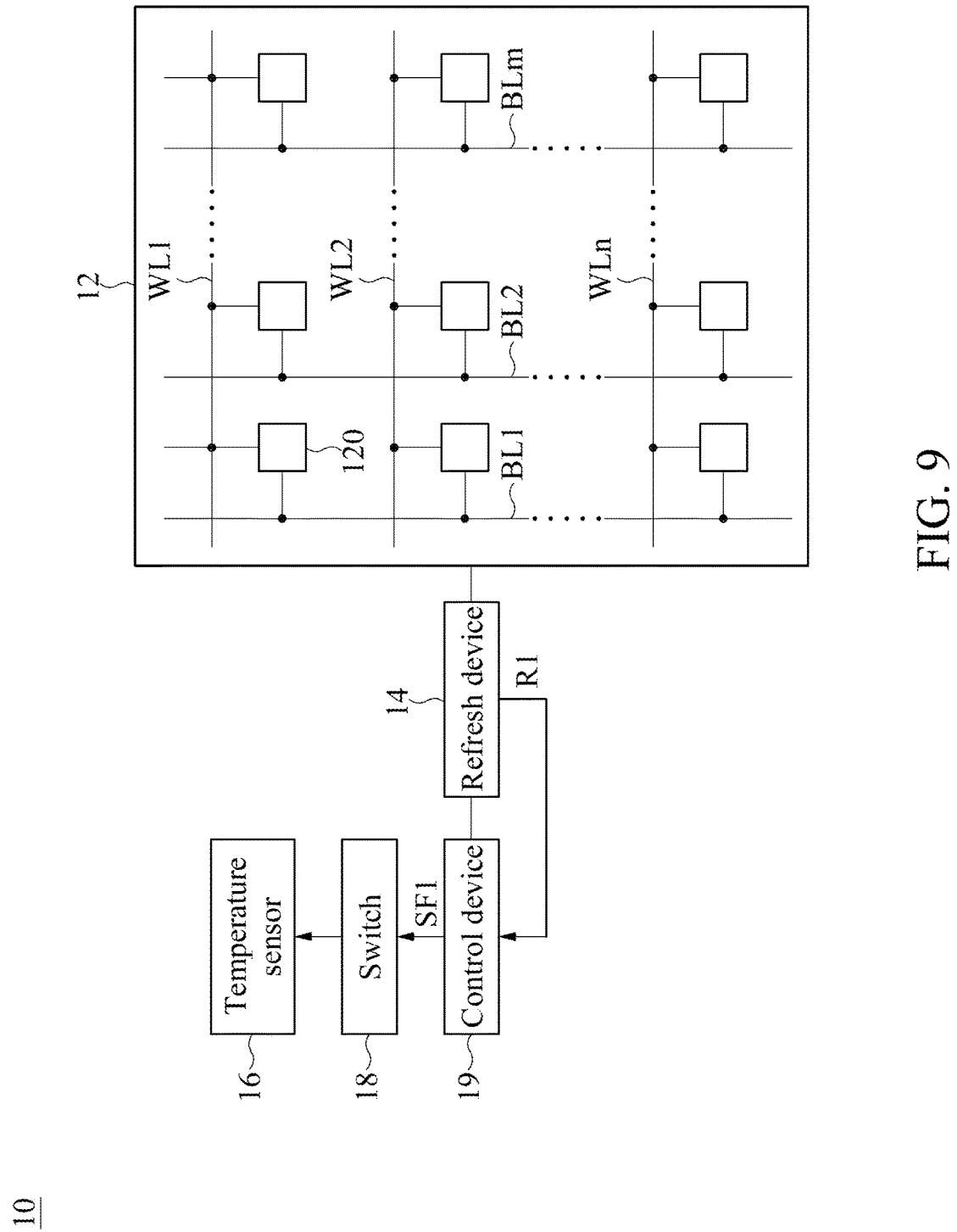
FIG. 9 is a schematic diagram illustrating a first scenario of the operation shown in FIG. 8, in accordance with some embodiments of the present disclosure.

FIG. 9 is a schematic diagram illustrating a first scenario of the operation shown in FIG. 8, in accordance with some embodiments of the present disclosure. Referring to FIG. 9, the control device 19 obtains information on a relatively high refresh rate R1 for a self-refresh operation. The control device 19 adjusts the sense frequency to a relatively low sense frequency SF1 based on the relatively high refresh rate R1, and activates the temperature sensor 16 according to the relatively low sense frequency SF1.

Figure 10:
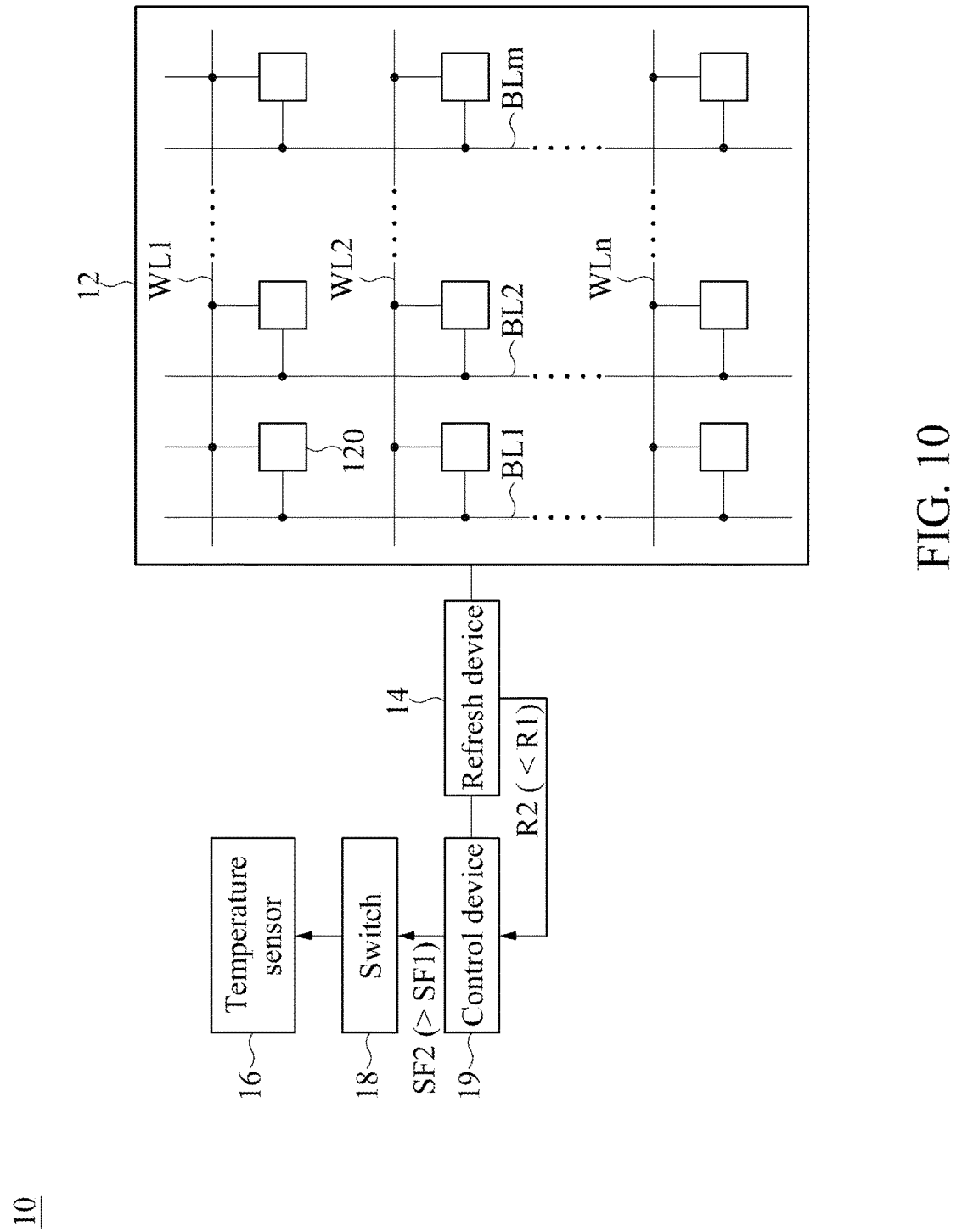
FIG. 10 is a schematic diagram illustrating a second scenario of the operation shown in FIG. 8, in accordance with some embodiments of the present disclosure.

FIG. 10 is a schematic diagram illustrating a second scenario of the operation shown in FIG. 8, in accordance with some embodiments of the present disclosure. Referring to FIG. 10, the control device 19 obtains information on a relatively low refresh rate R2, lower than the refresh rate R1. The control device 19 adjusts the sense frequency to a relatively high sense frequency SF2, higher than the sense frequency SF1, based on the relatively low refresh rate R2, and activates the temperature sensor 16 according to the relatively high sense frequency SF2.

As previously mentioned, in the present disclosure, the control device 19 is able to dynamically change a sense frequency of the temperature sensor 16. Hence, if the temperature increases suddenly, the refresh device 16 is able to increase the refresh rate for a self-refresh operation promptly. As a result, a data stored by the memory array 12 is relatively less likely to be lost. Moreover, the temperature sensor 16 senses the temperature a relatively smaller number of times in a given period when the refresh rate is relatively large. As a result, the DRAM 10 is more power efficient.

Figure 11:
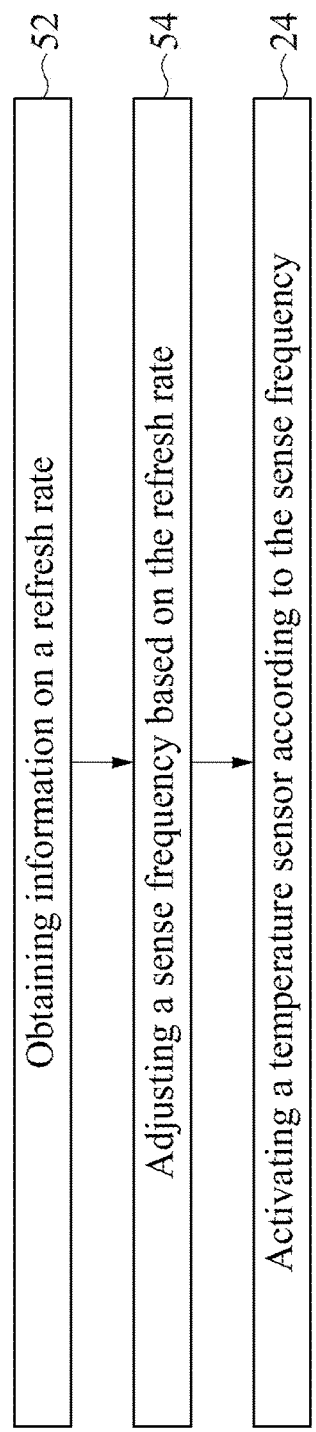
FIG. 11 is a flow chart of still another method of operating a DRAM, in accordance with some embodiments of the present disclosure.

FIG. 11 is a flow chart of still another method 50 of operating a DRAM, in accordance with some embodiments of the present disclosure. Referring to FIG. 11, the method 50 is similar to the method 20 described and illustrated with reference to FIG. 2 except that, for example, the method 50 includes operations 52 and 54.

The method 50 begins with operation 52, in which information on a refresh rate is obtained.

The method 50 proceeds to operation 54, in which a sense frequency is adjusted based on the refresh rate.

The method 50 is merely an example, and is not intended to limit the present disclosure beyond what is explicitly recited in the claims. Additional operations can be provided before, during, and after the method 50, and some operations described can be replaced, eliminated, or moved around for additional embodiments of the method.

Figure 12:
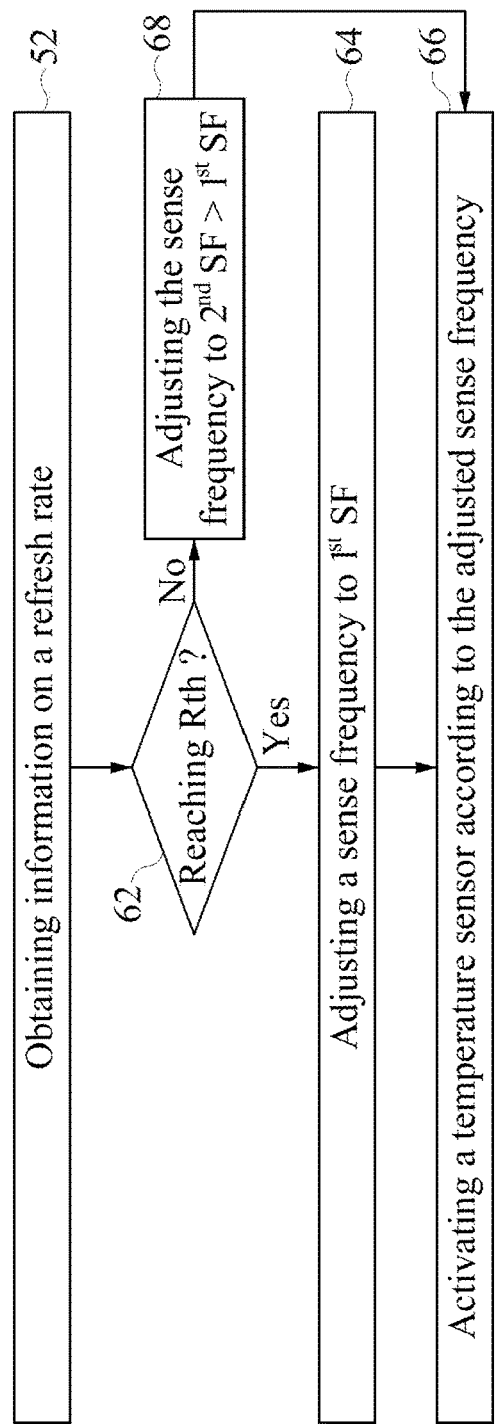
FIG. 12 is a flow chart of still yet another method of operating a DRAM, in accordance with some embodiments of the present disclosure.

FIG. 12 is a flow chart of still yet another method 60 of operating a DRAM, in accordance with some embodiments of the present disclosure. Referring to FIG. 12, the method 60 is similar to the method 50 described and illustrated with reference to FIG. 11 except that, for example, the method 60 further includes operations 62, 64, 66 and 68.

In operation 62, it is determined whether the refresh rate reaches a threshold refresh rate (Rth). If affirmative, the method 60 proceeds to operation 64, in which a sense frequency is adjusted to a first sense frequency ($1^{st}$ SF). If negative, the method 60 proceeds to operation 68, in which the sense frequency is adjusted to a second sense frequency ($2^{nd}$ SF) greater than the first sense frequency.

Subsequent to operations 64 and 68, in operation 66, the temperature sensor is activated according to the adjusted sense frequency.

The method 60 is merely an example, and is not intended to limit the present disclosure beyond what is explicitly recited in the claims. Additional operations can be provided before, during, and after the method 60, and some operations described can be replaced, eliminated, or moved around for additional embodiments of the method.

Figure 13:
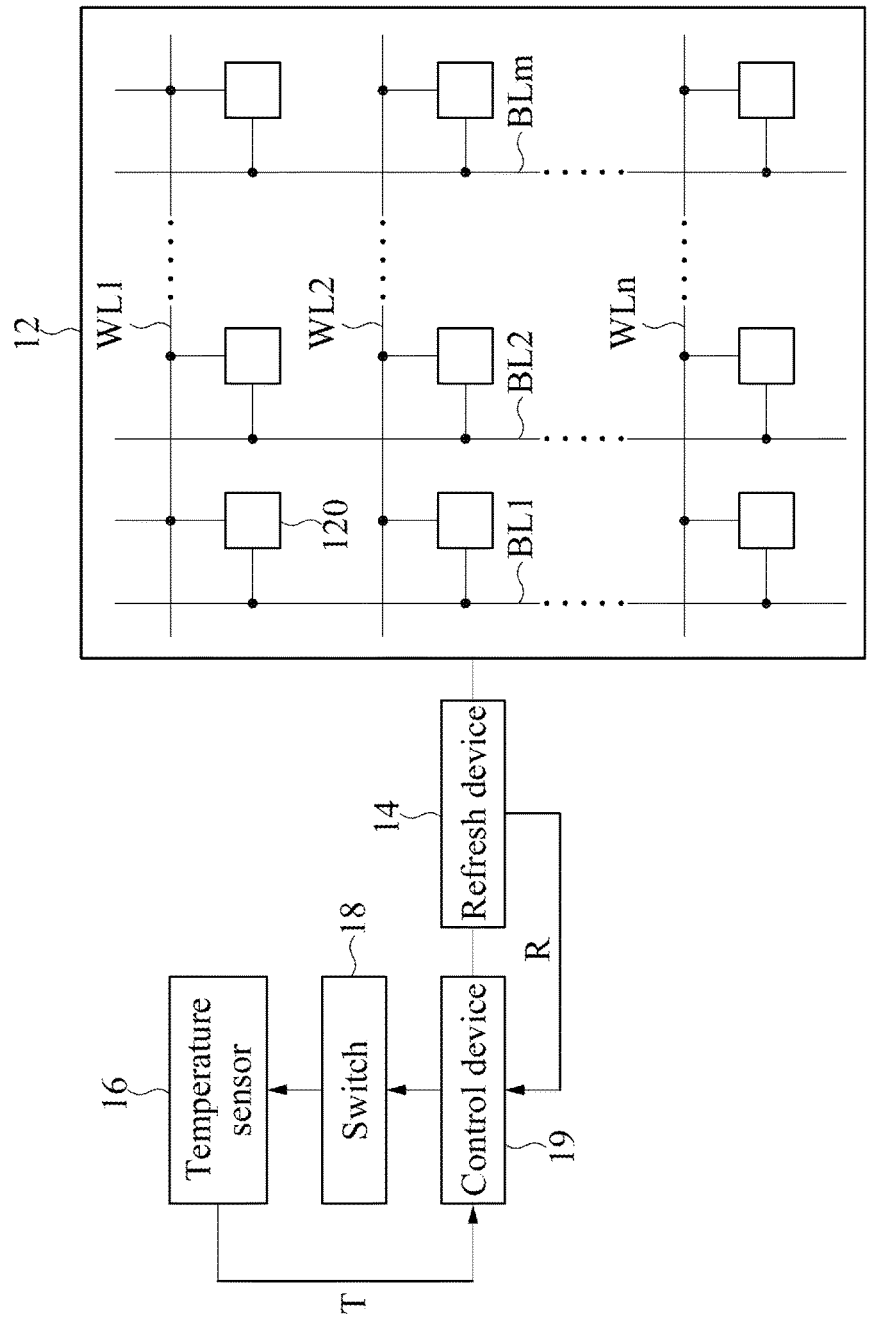
FIG. 13 is a schematic diagram illustrating yet another operation of the DRAM shown in FIG. 1, in accordance with some embodiments of the present disclosure.

FIG. 13 is a schematic diagram illustrating yet another operation of the DRAM 10 shown in FIG. 1, in accordance with some embodiments of the present disclosure. Referring to FIG. 13, the control device 19 functions to adjust the sense frequency based on both the temperature T and a refresh rate R of the memory array 12 for a self-refresh operation.

Detailed operations of the control device 19 based on both the temperature and the refresh rate are illustrated and described with reference to FIG. 15 below.

Figure 14:
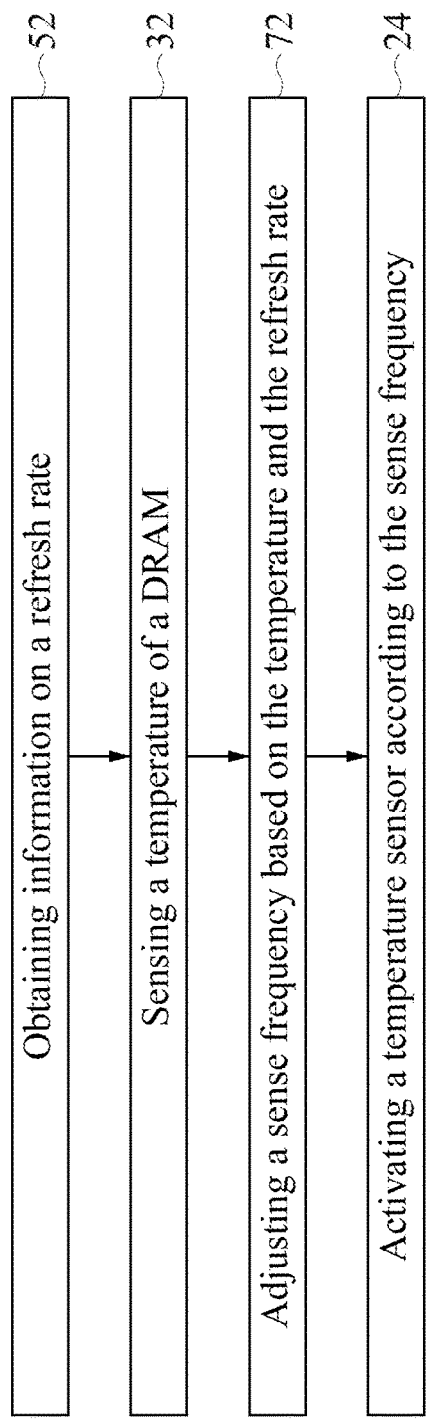
FIG. 14 is a flow chart of further another method of operating a DRAM, in accordance with some embodiments of the present disclosure.

FIG. 14 is a flow chart of further another method 70 of operating a DRAM, in accordance with some embodiments of the present disclosure. Referring to FIG. 14, the method 70 is similar to the method 50 described and illustrated with reference to FIG. 11 and the method 30 described and illustrated with reference to FIG. 6 except that, for example, the method 70 further includes operation 72.

In operation 72, a sense frequency is adjusted based on the temperature and the refresh rate.

The method 70 is merely an example, and is not intended to limit the present disclosure beyond what is explicitly recited in the claims. Additional operations can be provided before, during, and after the method 70, and some operations described can be replaced, eliminated, or moved around for additional embodiments of the method.

Figure 15:
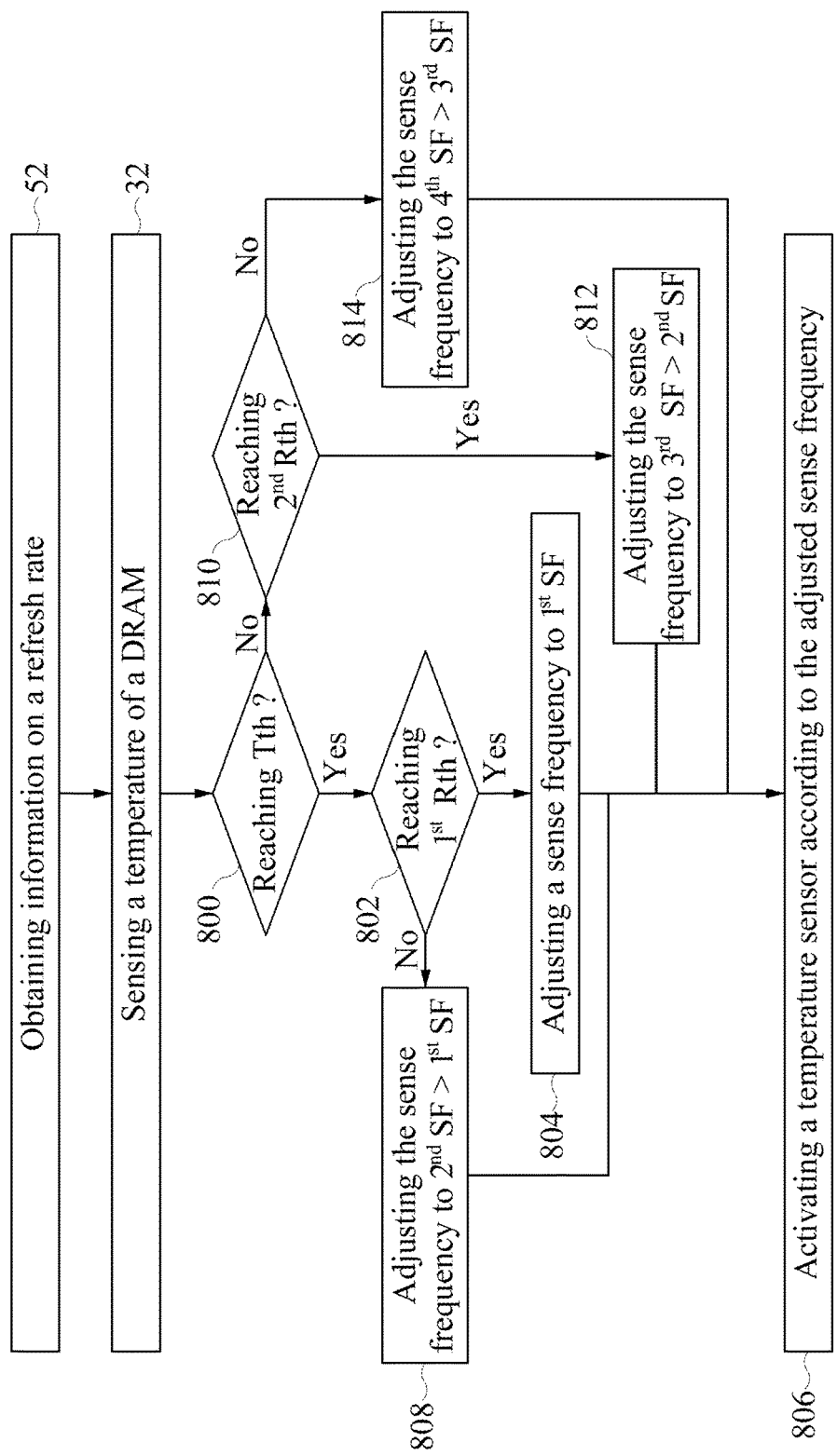
FIG. 15 is a flow chart of still further another method of operating a DRAM, in accordance with some embodiments of the present disclosure.

FIG. 15 is a flow chart of still further another method 80 of operating a DRAM, in accordance with some embodiments of the present disclosure. Referring to FIG. 15, the method 80 is similar to the method 70 described and illustrated with reference to FIG. 14 except that, for example, the method 80 includes operations 800, 802, 804, 806, 808, 810, 812 and 814.

In operation 800, it is determined whether the temperature reaches a threshold temperature (Tth). If affirmative, the method 80 proceeds to operation 802, in which it is determined whether the refresh rate reaches a first threshold refresh rate ($1^{st}$ Rth). If affirmative, the method 80 proceeds to operation 804, in which a sense frequency is adjusted to a first sense frequency ($1^{st}$ SF). If negative, the method 80 proceeds to operation 808, in which the sense frequency is adjusted to a second sense frequency ($2^{nd}$ SF) greater than the first sense frequency.

In operation 800, if the temperature does not reach the threshold temperature, the method 80 proceeds to operation 810, in which it is determined whether the refresh rate reaches a second threshold refresh rate ($2^{nd}$ Rth) lesser than the first threshold refresh rate. If affirmative, the method 80 proceeds to operation 812, in which the sense frequency is adjusted to a third sense frequency ($3^{rd}$ SF) greater than the second sense frequency. If negative, the method 80 proceeds to operation 814, in which the sense frequency is adjusted to a fourth sense frequency ($4^{th}$ SF) greater than the third sense frequency.

Subsequent to operations 804, 808, 812 and 814, in operation 806, a temperature sensor is activated according to the adjusted sense frequency.

The method 80 is merely an example, and is not intended to limit the present disclosure beyond what is explicitly recited in the claims. Additional operations can be provided before, during, and after the method 80, and some operations described can be replaced, eliminated, or moved around for additional embodiments of the method.

In the method 80, temperature is relatively significant in determining retention ability of the memory array 12, and refresh rate is relatively insignificant. Hence, the temperature serves as a first stage to determine how to adjust a sense frequency, and the refresh rate serves as a second stage. That is, the sense frequency is adjusted based on the temperature in a coarse-tune manner. Next, the sense frequency is adjusted based on the refresh rate in a fine-tune manner. However, the present disclosure is not limited thereto. In some embodiments, the refresh rate serves as a first stage, and the temperature serves as a second stage.

In the present disclosure, the control device 19 is able to dynamically change a sense frequency of the temperature sensor 16. Hence, if the temperature increases suddenly, the refresh device 16 is able to increase the refresh rate for a self-refresh operation promptly. As a result, a data stored by the memory array 12 is relatively less likely to be lost. Moreover, the temperature sensor 16 senses the temperature a relatively smaller number of times in a given period when the refresh rate is relatively large. As a result, the DRAM 10 is more power efficient.

One aspect of the present disclosure provides a DRAM. The DRAM includes a memory array, a temperature sensor and a control device. The temperature sensor is configured to sense a temperature of the DRAM. The control device is configured to adjust a sense frequency based on a retention ability of the memory array, and to activate the temperature sensor according to the adjusted sense frequency.

Another aspect of the present disclosure provides a dynamic random access memory (DRAM). The DRAM includes a memory array, a temperature sensor and a control device. The temperature sensor is configured to sense a temperature of the DRAM. The control device is configured to adjust a sense frequency based on both the temperature and a refresh rate of the memory array for a self-refresh operation, and to activate the temperature sensor according to the adjusted sense frequency. The adjusted sense frequency includes a first sense frequency in response to an event in which the temperature reaches a threshold temperature and the refresh rate reaches a threshold refresh rate.

Another aspect of the present disclosure provides a method of operating a dynamic random access memory (DRAM). The method comprises: sensing a temperature of the DRAM by a temperature sensor; adjusting a sense frequency based on a retention ability of the memory array; and activating the temperature sensor according to the adjusted sense frequency.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A dynamic random access memory (DRAM), comprising:
   a memory array;
   a temperature sensor configured to sense a temperature of the DRAM; and
   a control device configured to adjust a sense frequency based on a retention ability of the memory array, and to activate the temperature sensor according to the adjusted sense frequency,
   wherein an activation state of the temperature sensor depends on the adjusted sense frequency.

2. The DRAM of claim 1, wherein the control device is further configured to adjust the sense frequency based on the temperature.

3. The DRAM of claim 2, wherein the control device is further configured to adjust the sense frequency to a first sense frequency in response to an event in which the temperature satisfies a threshold temperature.

4. The DRAM of claim 3, wherein the control device is further configured to adjust the sense frequency to a second sense frequency greater than the first sense frequency in response to an event in which the temperature does not satisfy the threshold temperature.

5. The DRAM of claim 1, wherein the control device is further configured to adjust the sense frequency based on a refresh rate of the memory array for a self-refresh operation.

6. The DRAM of claim 5, wherein the control device is further configured to adjust the sense frequency to a first sense frequency in response to an event in which the refresh rate satisfies a threshold refresh rate.

7. The DRAM of claim 6, wherein the control device is further configured to adjust the sense frequency to a second sense frequency greater than the first sense frequency in response to an event in which the refresh rate does not satisfy the threshold refresh rate.

8. The DRAM of claim 1, wherein the control device is further configured to adjust the sense frequency based on both the temperature and a refresh rate of the memory array for a self-refresh operation.

9. The DRAM of claim 8, wherein the control device is further configured to adjust the sense frequency based on the temperature in a coarse-tune manner, and to adjust the sense frequency based on the refresh rate in a fine-tune manner.

10. The DRAM of claim 1, further comprising:
    a switch controllable by the control device;
    wherein the control device is configured to activate the temperature sensor by changing a conducted state of the switch according to the adjusted sense frequency.

11. A dynamic random access memory (DRAM), comprising:
    a memory array;
    a temperature sensor configured to sense a temperature of the DRAM; and
    a control device configured to adjust a sense frequency based on both the temperature and a refresh rate of the memory array for a self-refresh operation, and to activate the temperature sensor according to the adjusted sense frequency,
    wherein the adjusted sense frequency includes a first sense frequency in response to an event in which the temperature satisfies a threshold temperature and the refresh rate satisfies a first threshold refresh rate.

12. The DRAM of claim 11, wherein the adjusted sense frequency includes a second sense frequency, greater than the first sense frequency, in response to an event in which the temperature satisfies the threshold temperature and the refresh rate does not satisfy the first threshold refresh rate.

13. The DRAM of claim 12, wherein the adjusted sense frequency includes a third sense frequency, greater than the second sense frequency, in response to an event in which the temperature does not satisfy the threshold temperature and the refresh rate satisfies a second threshold refresh rate lesser than the first threshold refresh rate.

14. The DRAM of claim 13, wherein the adjusted sense frequency includes a fourth sense frequency, greater than the third sense frequency, in response to an event in which the temperature does not satisfy the threshold temperature and the refresh rate does not satisfy the second threshold refresh rate.

15. A method of operating a dynamic random access memory (DRAM), the method comprising:
    sensing a temperature of the DRAM by a temperature sensor;
    adjusting a sense frequency based on a retention ability of a memory array; and
    activating the temperature sensor according to the adjusted sense frequency,
    wherein an activation state of the temperature sensor is depends on the adjusted sense frequency.

16. The method of claim 15, further comprising:
    adjusting the sense frequency based on the temperature.

17. The method of claim 15, further comprising:
    adjusting the sense frequency based on a refresh rate of the memory array for a self-refresh operation.

18. The method of claim 15, further comprising:
    adjusting the sense frequency based on both the temperature and a refresh rate of the memory array for a self-refresh operation.

19. The method of claim 18, further comprising:
adjusting the sense frequency based on the temperature in a coarse-tune manner; and
adjusting the sense frequency based on the refresh rate in a fine-tune manner.

20. The method of claim 18, further comprising:
adjusting the sense frequency based on the refresh rate in a coarse-tune manner; and
adjusting the sense frequency based on the temperature in a fine-tune manner.

* * * * *